United States Patent
Lu et al.

(10) Patent No.: US 7,663,235 B2
(45) Date of Patent: Feb. 16, 2010

(54) SEMICONDUCTOR DIE WITH REDUCED BUMP-TO-PAD RATIO

(75) Inventors: Fang Lu, Rowland Heights, CA (US); Ali Salem, Mission Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 29 days.

(21) Appl. No.: 11/655,644

(22) Filed: Jan. 18, 2007

(65) Prior Publication Data

US 2008/0122080 A1    May 29, 2008

Related U.S. Application Data

(60) Provisional application No. 60/856,474, filed on Nov. 3, 2006.

(51) Int. Cl.
*H01L 23/48* (2006.01)

(52) U.S. Cl. .................. 257/737; 257/777; 257/E23.01; 257/686

(58) Field of Classification Search .................. 257/692, 257/678, 778–781; 438/612

See application file for complete search history.

(56) References Cited

U.S. PATENT DOCUMENTS

| | | | | |
|---|---|---|---|---|
| 6,472,745 B1 * | 10/2002 | Iizuka | ......................... | 257/723 |
| 6,511,901 B1 * | 1/2003 | Lam et al. | .................... | 438/612 |
| 6,534,853 B2 * | 3/2003 | Liu et al. | .................... | 257/692 |
| 2003/0183928 A1 * | 10/2003 | Miyazawa | .................. | 257/728 |
| 2005/0280127 A1 * | 12/2005 | Zhao et al. | .................. | 257/678 |

* cited by examiner

*Primary Examiner*—Fernando L Toledo
*Assistant Examiner*—Mamadou Diallo
(74) *Attorney, Agent, or Firm*—Farjami & Farjami LLP

(57) ABSTRACT

According to one exemplary embodiment, a semiconductor die includes at least one pad ring situated on an active surface of the semiconductor die, where the at least one pad ring includes a number of pads. The semiconductor die further includes a number of bumps including at least one shared bump. The at least one shared bump is shared by at least two pads, thereby causing the number of bumps to be fewer than the number of pads. The at least two pads can be at least two ground pads, at least two power pads, or at least two reference voltage pads.

17 Claims, 5 Drawing Sheets

SEMICONDUCTOR DIE WITH REDUCED BUMP-TO-PAD RATIO

The present application claims the benefit of and priority to a provisional patent application entitled "Flip-Chip Bump Sharing Method Using Single Pad-To-Bump Routing Layer," Ser. No. 60/856,474 filed on Nov. 3, 2006. The disclosure in that pending provisional application is hereby incorporated fully by reference into the present application.

BACKGROUND OF THE INVENTION

1. Field of the Invention

The present invention is generally in the field of semiconductor fabrication. More particularly, the invention is in the field of semiconductor die fabrication and packaging.

2. Background Art

A semiconductor die can be surface mounted to a package substrate employed to house the die by using flip chip technology. In flip chip technology, the semiconductor die is "flipped" over so that the active surface of the die faces the package substrate. Electrical contact between the semiconductor die and the package substrate is achieved through solder bumps (also referred to simply as "bumps" in the present application) that are placed on the active surface of the semiconductor die.

In a conventional "flip chip," each semiconductor die pad (also referred to simply as a "pad" in the present application) situated on the active surface of the die is connected to its corresponding unique bump using a pad-to-bump routing layer on the die. For complex dies with a large number of input and output data signals, clock signals, and ground and power pads, a large array of bumps is typically required on the die. However, the increasing number of bumps in the array on the semiconductor die presents some problems. For example, as the number of bumps increases, it becomes more difficult to route a connection between the pads and the bumps. As a result, multiple routing layers are typically required on the semiconductor die, which undesirably increases manufacturing cost.

SUMMARY OF THE INVENTION

A semiconductor die with reduced bump-to-pad ratio substantially as shown in and/or described in connection with at least one of the figures, as set forth more completely in the claims.

DETAILED DESCRIPTION OF THE INVENTION

The present invention is directed to a semiconductor die with reduced bump-to-pad ratio. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
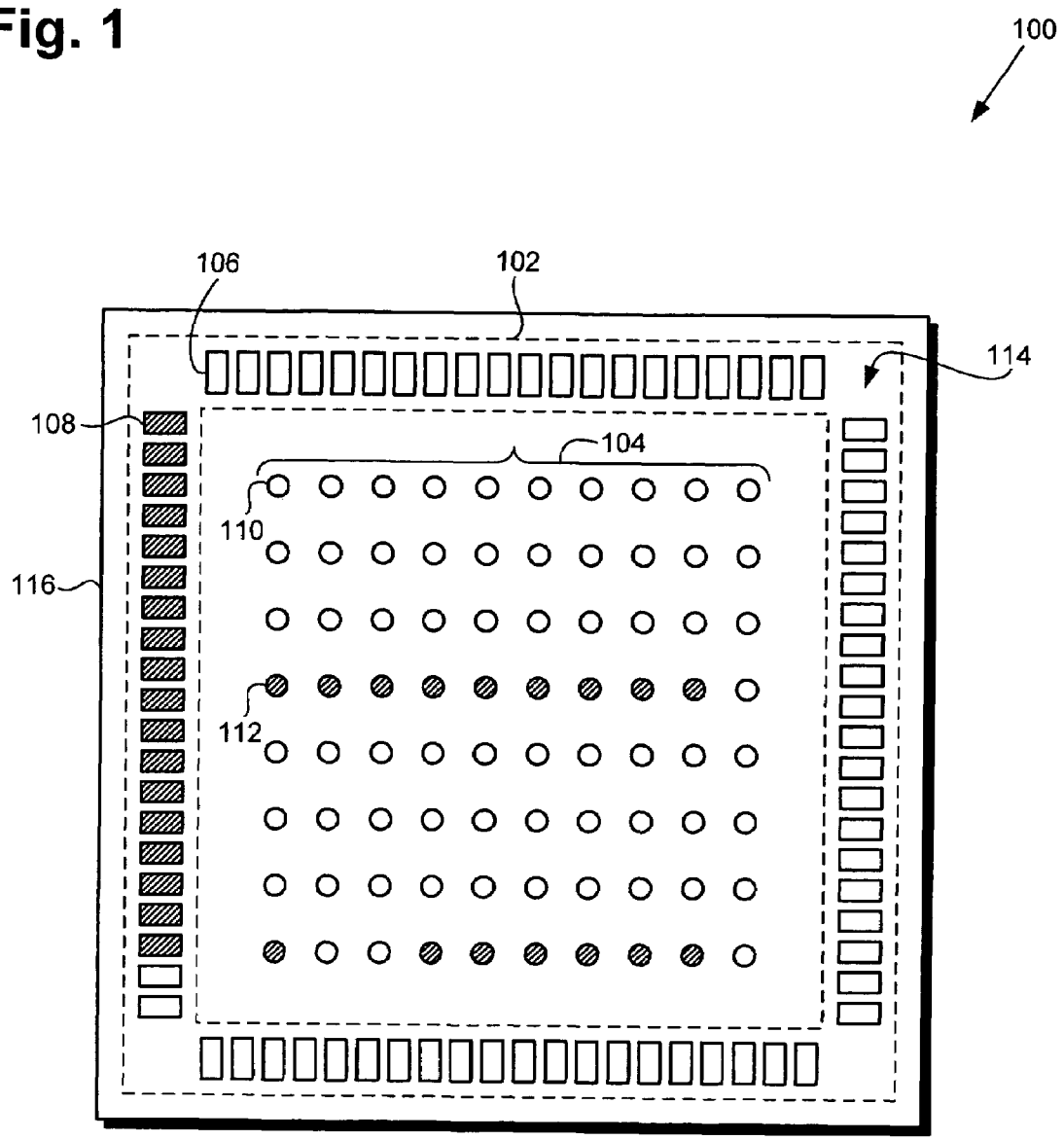
FIG. 1 shows a top view of an exemplary semiconductor die in accordance with one embodiment of the present invention.

FIG. 1 shows a top view of semiconductor die 100 in accordance with one embodiment of the present invention. Semiconductor die 100 includes pad ring 102 and bump array 104. It is noted that a "semiconductor die," such as semiconductor die 100, is also referred to as a "chip" or a "semiconductor chip" in the present application. Pad ring 102 includes a number of pads, such as pads 106 and 108 and bump array 104 includes a number of bumps (i.e. solder bumps), such as bumps 110 and 112. Semiconductor die 100 can utilize flip chip packaging technology, wherein the die can be "flipped" to allow bump array 104 on active surface 114 of the die to make direct electrical contact with a package substrate (not shown in FIG. 1). It is noted that in FIG. 1, only pads 106 and 108 and bumps 110 and 112 are specifically discussed herein to preserve brevity.

As shown in FIG. 1, pad ring 102 is situated on the perimeter of active surface 114 of semiconductor die 100 and includes a number of pads, such as pads 106 and 108. Also shown in FIG. 1, bump array 104 is situated on active surface 114 of semiconductor die 100, is surrounded by pad ring 102, and includes a number of bumps, such as bumps 110 and 112. In the embodiment in FIG. 1, bumps in bump array 104 are interconnected to pads in pad ring 102 using a single pad-to-bump routing layer (also referred to simply as a "routing layer" in the present application), which is situated on semiconductor die 100 but not shown in FIG. 1. In another embodiment, the bumps in bump array 104 can be interconnected to the pads in pad ring 102 using more than one routing layer on semiconductor die 100.

Bump array 104 includes one or more "shared" bumps, wherein each shared bump is shared by at least two pads in pad ring 102. For example, a shared bump in bump array 104 can be interconnected to two pads in pad ring 102 by interconnect lines (not shown in FIG. 1) connected between the respective pads and the shared bump, where the interconnect lines are situated in one routing layer (not shown in FIG. 1) on semiconductor die 100. By utilizing shared bumps, the invention achieves a reduced bump-to-pad ratio by reducing the total number of bumps on the active surface of the semiconductor die without reducing the total number of pads that require bumps. Thus, the invention achieves a bump-to-pad ratio equal to less than 1.0 on the active surface of the semiconductor die. In one embodiment, the invention achieves a bump-to-pad ratio equal to approximately 0.5 on the active surface of the semiconductor die. Cross-hatch shaded bumps, such as bump 112, and cross-hatch shaded pads, such as pad 108, which are situated adjacent to die edge 116, are further discussed below in relation to FIG. 2.

Figure 2:
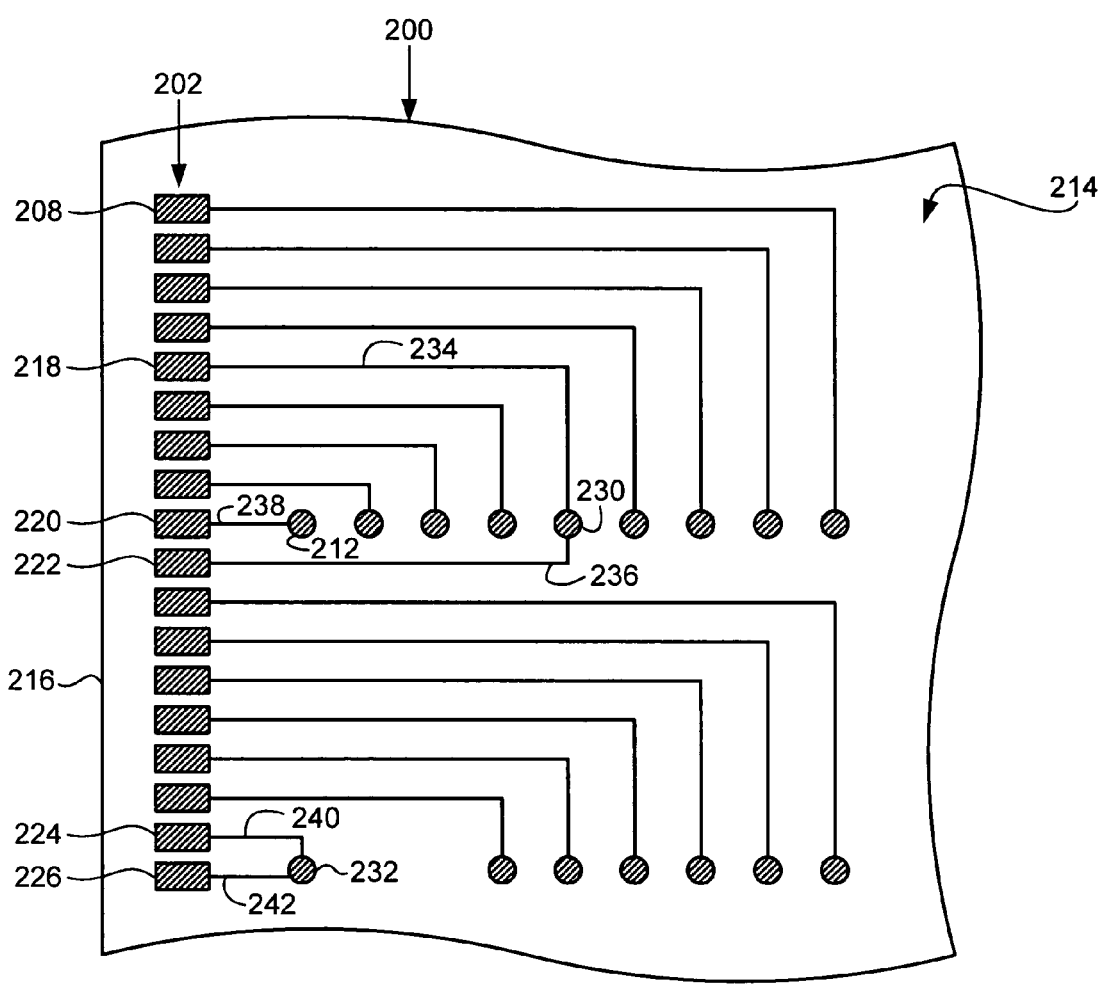
FIG. 2 shows a top view of a portion of the exemplary semiconductor die of FIG. 1.

FIG. 2 shows a top view of an enlarged portion of semiconductor die 100 in FIG. 1. In FIG. 2, pad ring 202, cross-hatch shaded bumps, such as bump 212, cross-hatch shaded pads, such as pad 208, active surface 214, and die edge 216 of semiconductor die portion 200 correspond, respectively, to pad ring 102, cross-hatch shaded bumps, such as bump 112, cross-hatch shaded pads, such as pad 108, active surface 114, and die edge 116 of semiconductor die 100 in FIG. 1. Semiconductor die portion 200 includes pads 208, 218, 220, 222, 224, and 226 (hereinafter "pads 208 through 226"), bump 212, shared bumps 230 and 232, and interconnect lines 234, 236, 238, 240, and 242 (hereinafter "interconnect lines 234 through 242"). It is noted that in FIG. 2, only pads 208 through 226, bump 212, shared bumps 230 and 232, and interconnect lines 234 through 242 are specifically discussed herein to preserve brevity.

As shown in FIG. 2, pads 218 and 222 are connected to shared bump 230 by respective interconnect lines 234 and 236, pad 220 is connected to bump 212 by interconnect line 238, and pads 224 and 226 are connected to shared bump 232 by respective interconnect lines 240 and 242. Pads 208 through 226 are situated in an interconnect metal layer in the semiconductor die, i.e., semiconductor die 100 in FIG. 1, can comprise a metal such as copper or aluminum. Pads 208 through 226 can each have a width of approximately 20.0 microns and a length of between 20.0 and 50.0 microns, for example.

Pad 220 can be a signal pad, pads 218 and 222 can be ground, power, or reference voltage pads, and pads 224 and 226 can also be ground, power, or reference voltage pads. In the present invention, power pads that each have the same supply voltage, such as Vdd, can be connected to the same shared bump. Also, reference voltage pads that each have the same reference voltage can be connected to the same shared bump. Additionally, multiple ground pads, including ground pads that are each connected to ground for a different section of the semiconductor die, such as a core section or an output driver section, can be connected to the same shared bump. Thus, in the embodiment of the invention in FIGS. 1 and 2, a shared bump can be connected to multiple power pads, multiple reference voltage pads, or multiple ground pads on the semiconductor die.

Bump 212 and shared bumps 230 and 232 can each have a diameter of approximately 100.0 microns, for example. In the embodiment in FIGS. 1 and 2, interconnect lines that connect pads to bumps, such as interconnect lines 234 through 242, can be situated in a single routing layer, which can be a redistribution layer (RDL), for example. In another embodiment, interconnect lines that connect pads to bumps can be situated in a single routing layer that is not an RDL. In another embodiment, two or more routing layers can be used to interconnect pads to bumps. Interconnect lines 234 through 242 can each comprise metal, such as copper or aluminum, and can each have a typical width of approximately 20.0 microns and a minimum width of approximately 10.0 microns, for example. The spacing between adjacent interconnect lines, such as interconnect lines 236 and 238, can be approximately 2.0 microns, for example.

In the embodiment in FIGS. 1 and 2, a shared bump can be connected to either adjacent pads or non-adjacent pads. For example, shared bump 230 is connected to non-adjacent pads 218 and 222, which are separated by intervening pads, such as pad 220, while shared bump 232 is connected to adjacent pads 224 and 226.

Thus, in the embodiment in FIGS. 1 and 2, the invention achieves a semiconductor die having a reduced bump-to-pad ratio by utilizing shared bumps on the active surface of the semiconductor die. As a result, the embodiment of the invention in FIGS. 1 and 2 reduces the total number of bumps on the semiconductor die without reducing the total number of pads that require bumps, thereby advantageously reducing manufacturing cost. Also, in the embodiment in FIGS. 1 and 2, the invention achieves a semiconductor die that utilizes a single pad-to-bump routing layer to interconnect pads to bumps situated on the active surface of the semiconductor die, thereby advantageously providing a further reduction in manufacturing cost.

Figure 3:
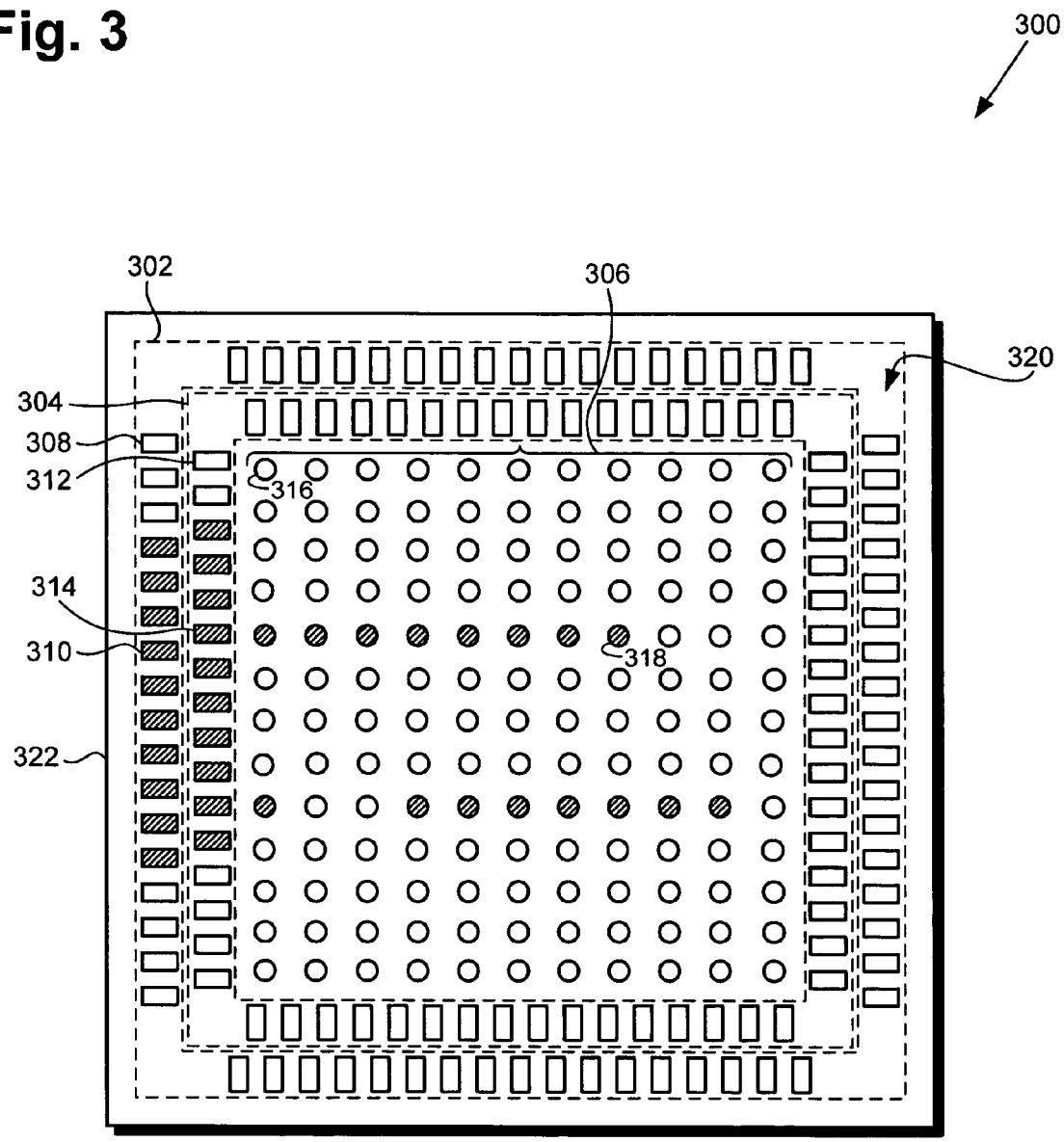
FIG. 3 shows a top view of an exemplary semiconductor die in accordance with one embodiment of the present invention.

FIG. 3 shows a top view of semiconductor die 300 in accordance with one embodiment of the present invention. Semiconductor die 300 includes pad rings 302 and 304 and bump array 306. Pad ring 302 includes a number of pads, such as pads 308 and 310, pad ring 304 includes a number of pads, such as pads 312 and 314, and bump array 306 includes a number of bumps, such as bumps 316 and 318. Similar to semiconductor die 100 in FIG. 1, semiconductor die 300 can also utilize flip chip packaging technology, wherein the die can be "flipped" to allow bump array 306 on active surface 320 of the die to make direct electrical contact with a package substrate (not shown in FIG. 3). It is noted that in FIG. 3, only pads 308, 310, 312, and 314 and bumps 316 and 318 are specifically discussed herein to preserve brevity.

As shown in FIG. 3, pad ring 302 is situated on the perimeter of active surface 320 of semiconductor die 300 and pad ring 304 is situated on active surface 320 adjacent to pad ring 302. Thus, pad ring 302 forms an "outer" pad ring and pad ring 304 forms an "inner" pad ring. Also shown in FIG. 3, bump array 306 is situated on active surface 320 of semiconductor die 300 and is surrounded by pad rings 302 and 304. In the embodiment in FIG. 3, bumps in bump array 306 are interconnected to pads in pad rings 302 and 304 by using a single routing layer (not shown in FIG. 3) on semiconductor die 300. In another embodiment, the bumps in bump array 306 can be interconnected to the pads in pad rings 302 and 304 by using more than one routing layer on semiconductor die 300.

Bump array 306 includes one or more shared bumps, wherein each shared bump is shared by at least two pads, which can be situated in pad ring 302, pad ring 304, or in pad rings 302 and 304. For example, a shared bump in bump array 306 can be connected to a pad in pad ring 302 and connected to a pad in pad ring 304 by utilizing interconnect lines (not shown in FIG. 3) that are situated in a single routing layer (not shown in FIG. 3) on semiconductor die 300. By utilizing shared bumps, the embodiment of the invention in FIG. 3 achieves similar advantages as discussed above for the embodiment of the invention in FIGS. 1 and 2. Cross-hatch shaded bumps, such as bump 318, and cross-hatch shaded pads, such as pad 310 in pad ring 302 and pad 314 in pad ring 304, which are situated adjacent to die edge 322, are further discussed below in relation to FIG. 4.

Figure 4:
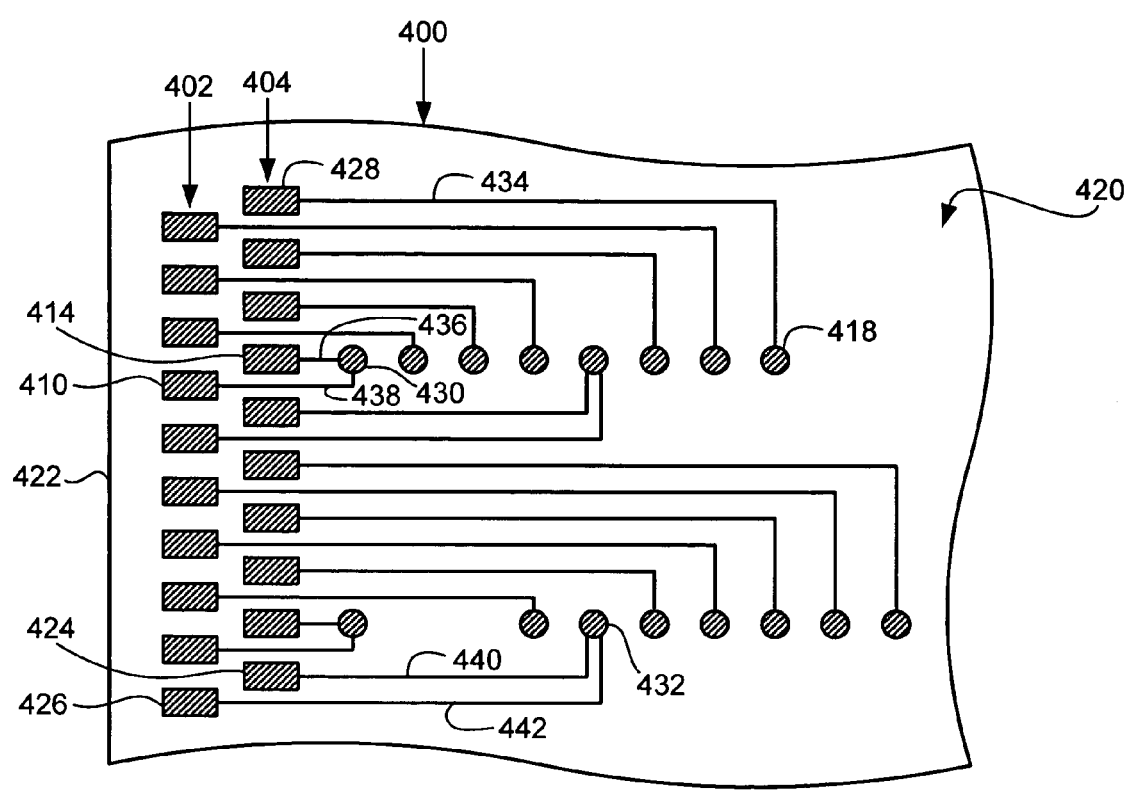
FIG. 4 shows a top view of a portion of the exemplary semiconductor die of FIG. 3.

FIG. 4 shows a top view of an enlarged portion of semiconductor die 300 in FIG. 3. In FIG. 4, pad ring 402, pad ring 404, cross-hatch shaded pads, such as pads 410 and 414, cross-hatch shaded bumps, such as bump 418, active surface 420, and die edge 422 of semiconductor die portion 400 correspond, respectively, to pad ring 302, pad ring 304, cross-hatch shaded pads, such as pads 310 and 314, cross-hatch shaded bumps, such as bump 318, active surface 320, and die edge 322 of semiconductor die 300 in FIG. 3. Semiconductor die portion 400 includes pads 410, 414, 424, 426, and 428 (hereinafter "pads 410 through 428"), bump 418, shared bumps 430 and 432, and interconnect lines 434, 436, 438, 440, and 442 (hereinafter "interconnect lines 434 through 442"). It is noted that in FIG. 4, only pads 410 through 428, bump 418, shared bumps 430 and 432, and interconnect lines 434 through 442 are specifically discussed herein to preserve brevity.

As shown in FIG. 4, pad 428 is connected to bump 418 by interconnect line 434, pads 410 and 414 are connected to shared bump 430 by respective interconnect lines 438 and 436, and pads 424 and 426 are connected to shared bump 432 by respective interconnect lines 440 and 442. Pads 410 through 428 are situated in an interconnect metal layer in the semiconductor die, i.e., semiconductor die 300 in FIG. 3, and are each substantially similar in size and composition as each of pads 208 through 226 in FIG. 2. Pad 428 can be a signal pad, pads 410 and 414 can be ground, power, or reference voltage pads, and pads 424 and 426 can also be ground, power, or reference voltage pads. Thus, in the embodiment of the invention in FIGS. 3 and 4, a shared bump can be connected to multiple power pads, multiple reference voltage pads, or multiple ground pads on the semiconductor die.

Bump 418 and shared bumps 430 and 432 can each have a diameter of approximately 100.0 microns, for example. In the embodiment in FIGS. 3 and 4, interconnect lines that connect pads to bumps, such as interconnect lines 434 through 442, can be situated in a single routing layer, i.e., a single pad-to-bump routing layer, which can be an RDL, for example. In another embodiment, interconnect lines 434 through 442 can be situated in a single routing layer that is not an RDL. In another embodiment, interconnect lines that connect pads to bumps, such as interconnect lines 434 through 442, can be situated in two or more routing layers. Interconnect lines 434 through 442 are each substantially similar in composition and width as each of interconnect lines 234 through 242 in FIG. 2. The spacing between adjacent interconnect lines, such as interconnect lines 436 and 438, can be approximately 2.0 microns, for example.

In the embodiment in FIGS. 3 and 4, a shared bump can be interconnected to pads in different pad rings. For example, shared bump 430 is connected to pad 410 in pad ring 402 and pad 414 in pad ring 404. Thus, in addition to the advantages achieved above in the embodiment in FIGS. 1 and 2, the embodiment of the invention in FIGS. 3 and 4 advantageously utilizes a single pad-to-bump routing layer to connect shared bumps pads, where each shared bump can be connected to pads situated in different pad rings on the active surface of the die.

Figure 5:
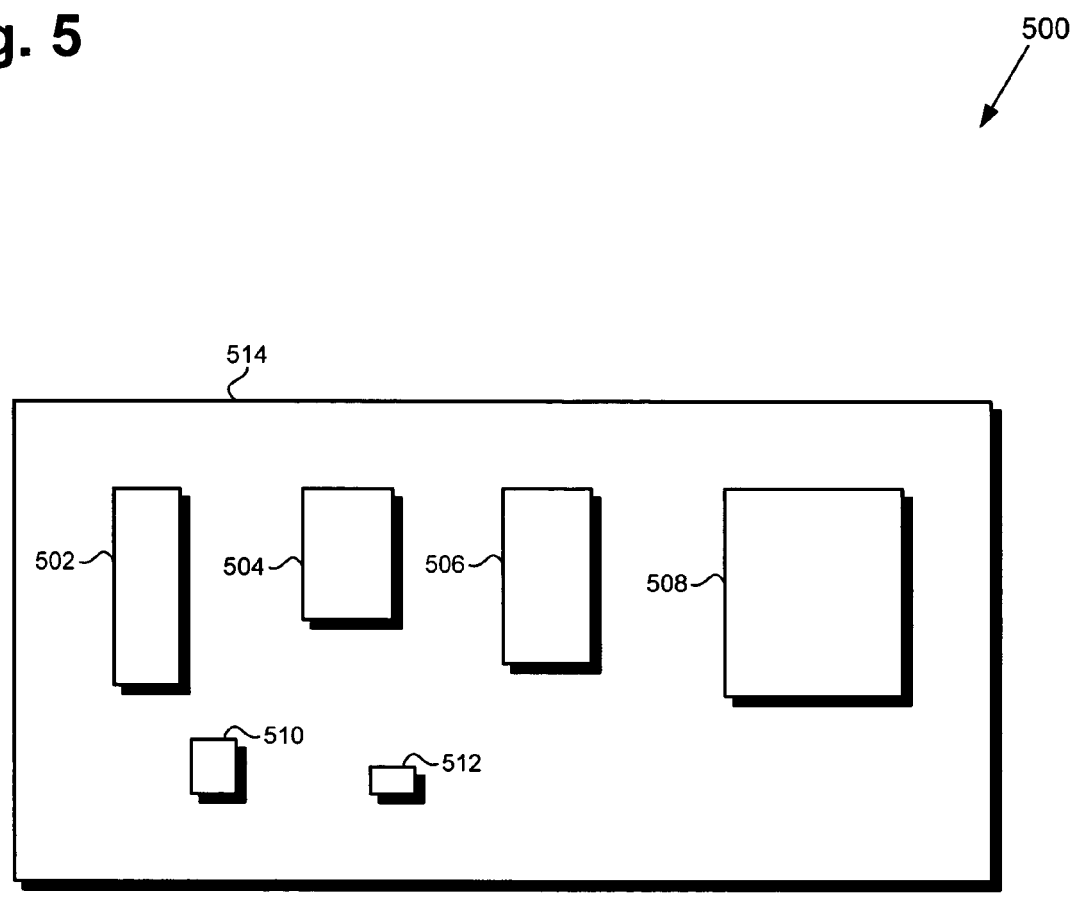
FIG. 5 is a diagram of an exemplary electronic system including an exemplary semiconductor die in accordance with one embodiment of the present invention.

FIG. 5 illustrates a diagram of an exemplary electronic system including an exemplary chip or die in accordance with one embodiment of the present invention. Electronic system 500 includes exemplary modules 502, 504, and 506, IC chip or semiconductor die 508, discrete components 510 and 512, residing in and interconnected through circuit board 514. In one embodiment, electronic system 500 may include more than one circuit board. IC chip 508 can comprise one of the invention's semiconductor dies, such as semiconductor die 100 in FIG. 1 or semiconductor die 300 in FIG. 3, as described above.

As shown in FIG. 5, modules 502, 504, and 506 are mounted on circuit board 514 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electromechanical motor control module, or a field programmable gate array (FPGA), or any other kind of module utilized in modern electronic circuit boards. Circuit board 514 can include a number of interconnect traces (not shown in FIG. 5) for interconnecting modules 502, 504, and 506, discrete components 510 and 512, and IC chip 508.

Also shown in FIG. 5, IC chip 508 is surface mounted on circuit board 514 and comprises an embodiment of the invention's semiconductor die. In one embodiment, IC chip 508 may be mounted on a substrate in a semiconductor package, which can be in turn mounted on circuit board 514. In another embodiment, IC chip 508 may not be mounted on circuit board 514, and may be interconnected with other modules on different circuit boards. Further shown in FIG. 5, discrete components 510 and 512 are mounted on circuit board 514 and can each be, for example, a discrete filter, such as one including a BAW or SAW filter or the like, a power amplifier or an operational amplifier, a semiconductor device, such as a transistor or a diode or the like, an antenna element, an inductor, a capacitor, or a resistor.

Electronic system 500 can be utilized in, for example, a wired or wireless communications device, a cell phone, a switching device, a router, a repeater, a codec, a wired or wireless LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring equipment, a digital avionics device, a medical device, or a digitally-controlled medical equipment, or in any other kind of system, device, component or module utilized in modern electronics applications.

Thus, as discussed above in the embodiments in FIGS. 1 and 2 and FIGS. 3 and 4, by using one or more shared bumps on an active surface of a semiconductor die, the invention achieves a reduced number of bumps on the active surface of the die without reducing the number of pads that require bumps. By reducing the total number of bumps on the active surface of the semiconductor die, the invention advantageously achieves a semiconductor die having a reduced manufacturing cost. Also, in the embodiments in FIGS. 1 and 2 and FIGS. 3 and 4, the invention's semiconductor die advantageously requires only a single pad-to-bump routing layer to interconnect pads and bumps on the active surface of the die, thereby further reducing manufacturing cost.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a semiconductor die with a reduced bump-to-pad ratio has been described.

The invention claimed is:

1. A semiconductor die comprising:
at least one pad ring situated on an active surface of said semiconductor die, said at least one pad ring comprising a plurality of pads;
a plurality of bumps including at least one shared bump;
a plurality of shared bumps each being shared by at least two of said plurality of pads situated within said at least one pad ring;
said plurality of shared bumps reducing a quantity of said plurality of bumps required for ground, power, and reference voltages.

2. The semiconductor die of claim 1, wherein said at least two of said plurality of pads are interconnected to said at least one shared bump using a single routing layer on said semiconductor die.

3. The semiconductor die of claim 1, wherein said semiconductor die comprises at least two pad rings.

4. The semiconductor die of claim 3, wherein a first of said at least two of said plurality of pads is situated in a first pad ring and a second of said at least two of said plurality of pads is situated in a second pad ring.

5. The semiconductor die of claim 1, wherein at least one intervening pad is situated between said at least two of said plurality of pads.

6. The semiconductor die of claim 1, wherein said plurality of bumps are interconnected to said plurality of pads using a single routing layer on said semiconductor die.

7. The semiconductor die of claim 1, wherein said plurality of bumps are interconnected to said plurality of pads using more than one routing layer on said semiconductor die.

8. A semiconductor die comprising:
   at least one pad ring situated on an active surface of said semiconductor die, said at least one pad ring comprising a plurality of pads;
   a plurality of bumps comprising at least one shared bump;
   a plurality of shared bumps each being interconnected to at least two of said plurality of pads situated within said at least one pad ring using a single routing layer on said semiconductor die;
   said plurality of shared bumps reducing a quantity of said plurality of bumps required for ground, power, and reference voltages.

9. The semiconductor die of claim 8, wherein said semiconductor die comprises at least two pad rings.

10. The semiconductor die of claim 9, wherein a first of said at least two of said plurality of pads is situated in a first pad ring and a second of said at least two of said plurality of pads is situated in a second pad ring.

11. The semiconductor die of claim 8, wherein said plurality of bumps are interconnected to said plurality of pads using said single routing layer on said semiconductor die.

12. The semiconductor die of claim 8, wherein at least one intervening pad is situated between said at least two of said plurality of pads.

13. An electronic system comprising a semiconductor die, said semiconductor die comprising:
   at least one pad ring situated on an active surface of said semiconductor die, said at least one pad ring comprising a plurality of pads;
   a plurality of bumps comprising at least one shared bump;
   a plurality of shared bumps each being shared by at least two of said plurality of pads situated within said at least one pad ring;
   said plurality of shared bumps reducing a quantity of said plurality of bumps required for ground, power, and reference voltages.

14. The electronic system of claim 13, wherein said at least two of said plurality of pads are interconnected to said at least one shared bump using a single routing layer on said semiconductor die.

15. The electronic system of claim 13, wherein said semiconductor die comprises at least two pad rings.

16. The electronic system of claim 15, wherein a first of said at least two of said plurality of pads is situated in a first pad ring and a second of said at least two of said plurality of pads is situated in a second pad ring.

17. The electronic system of claim 13, wherein said electronic system is selected from the group consisting of a wired or wireless communications device, a cell phone, a switching device, a router, a repeater, a codec, a wired or wireless LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring equipment, a digital avionics device, a medical device, and a digitally-controlled medical equipment.

* * * * *